(12) United States Patent
Chung et al.

(10) Patent No.: US 11,037,833 B2
(45) Date of Patent: Jun. 15, 2021

(54) FABRICATION METHOD OF SEMICONDUCTOR DEVICE WITH SPACER TRIMMING PROCESS

(71) Applicant: UNITED MICROELECTRONICS CORP., Hsin-Chu (TW)

(72) Inventors: Yao-Hsien Chung, Kaohsiung (TW); Hao-Hsuan Chang, Kaohsiung (TW); Ting-An Chien, Tainan (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 39 days.

(21) Appl. No.: 16/455,762

(22) Filed: Jun. 28, 2019

(65) Prior Publication Data
US 2020/0411384 A1   Dec. 31, 2020

(51) Int. Cl.
| | |
|---|---|
| H01L 21/82 | (2006.01) |
| H01L 21/8234 | (2006.01) |
| H01L 29/78 | (2006.01) |
| H01L 29/66 | (2006.01) |
| H01L 29/423 | (2006.01) |

(52) U.S. Cl.
CPC ........ *H01L 21/823468* (2013.01); *H01L 21/823431* (2013.01); *H01L 21/823437* (2013.01); *H01L 29/4236* (2013.01); *H01L 29/6653* (2013.01); *H01L 29/66545* (2013.01); *H01L 29/66795* (2013.01); *H01L 29/7851* (2013.01)

(58) Field of Classification Search
CPC .............................................. H01L 21/823468
See application file for complete search history.

(56) References Cited

U.S. PATENT DOCUMENTS

| | | | |
|---|---|---|---|
| 7,208,361 B2 | 4/2007 | Shah | |
| 8,357,603 B2 | 1/2013 | Chan | |
| 9,530,696 B1* | 12/2016 | Liu | ............... H01L 29/7848 |
| 9,589,846 B1 | 3/2017 | Tsai | |
| 9,685,533 B1 | 6/2017 | Kuo | |
| 2004/0198009 A1* | 10/2004 | Chen | ............... H01L 29/66545 |
| | | | 438/303 |
| 2014/0073103 A1* | 3/2014 | Won | ............... H01L 21/823462 |
| | | | 438/287 |
| 2015/0380514 A1* | 12/2015 | Bentley | ............... H01L 29/7834 |
| | | | 257/346 |
| 2017/0243952 A1* | 8/2017 | Kuo | ............... H01L 29/0847 |

* cited by examiner

*Primary Examiner* — Robert T Huber
*Assistant Examiner* — Laura M Dykes
(74) *Attorney, Agent, or Firm* — Winston Hsu (57) ABSTRACT

A method for forming a semiconductor device is provided. A dielectric layer is formed on a substrate. First and second gate trenches are formed in the dielectric layer. First and second spacers are disposed in the first and the second gate trenches, respectively. A patterned photoresist is formed on the dielectric layer. The patterned photoresist masks the first region and exposes the second region. Multiple cycles of spacer trimming process are performed to trim a sidewall profile of the second spacer. Each cycle comprises a step of oxygen stripping and a successive step of chemical oxide removal. The patterned photoresist is then removed to reveal the first region.

8 Claims, 8 Drawing Sheets

FABRICATION METHOD OF SEMICONDUCTOR DEVICE WITH SPACER TRIMMING PROCESS

BACKGROUND OF THE INVENTION

1. Field of the Invention

The present disclosure relates to semiconductor technology. More particularly, the present disclosure relates to a semiconductor device and a method for fabricating the same.

2. Description of the Prior Art

The manufacture of advanced integrated circuits, such as CPUs, storage devices, ASICs (application specific integrated circuits) and the like, requires the formation of a large number of circuit elements in a given chip area according to a specified circuit layout. Field effect transistors (NMOS and PMOS transistors) represent one important type of circuit element that substantially determines performance of such integrated circuits. During the fabrication of complex integrated circuits using, for instance, MOS technology, millions of transistors, e.g., NFET transistors and/or PFET transistors, are formed on a substrate including a crystalline semiconductor layer.

A field effect transistor, whether an NFET or a PFET device, is a planar device that typically includes a source region, a drain region, a channel region that is positioned between the source region and the drain region, a gate insulating layer and a gate electrode positioned above the gate insulating layer over the channel region. By applying an appropriate voltage to the gate electrode, the channel region becomes conductive and current is allowed to flow from the source region to the drain region.

For many early device technology generations, the gate structures of most transistor elements have been comprised of a plurality of silicon-based materials, such as a silicon dioxide and/or silicon oxynitride gate insulating layer, in combination with a polysilicon gate electrode. However, as the channel length of aggressively scaled transistor elements have become increasingly smaller, many newer generation devices employ gate structures that contain alternative materials in an effort to avoid the short channel effects which may be associated with the use of traditional silicon-based materials in reduced channel length transistors.

Gate structures that include a so-called high-k dielectric gate insulating layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations. One well-known processing method that has been used for forming a transistor with a high-k/metal gate structure is the so-called "gate last" or "replacement metal gate" (RMG) technique.

In a conventional RMG process, spacers at both sides of the dummy polysilicon gate are vulnerable to the etching process for removing the sacrificial gate insulating layer after the polysilicon gate electrode is removed. The consumption of the spacers may cause CD (critical dimension) bias on the resulting metal gate structure. Additionally, with the reduction of the width of the spacers due to the consumption, the parasitic capacitance of the semiconductor device would be increased and affects its electrical performance. Therefore, it is necessary for those skilled in the art to develop an effective structure or method to solve this issue.

SUMMARY OF THE INVENTION

The invention provides an improved method for forming a semiconductor device, which is capable of avoiding the above-mentioned prior art shortcomings or problems.

According to one aspect of the present disclosure, a method for forming a semiconductor device is provided. A dielectric layer is formed on a substrate. First and second gate trenches are formed in the dielectric layer. First and second spacers are disposed in the first and the second gate trenches, respectively. A patterned photoresist is formed on the dielectric layer. The patterned photoresist masks the first region and exposes the second region. N cycles of spacer trimming process are performed to trim a sidewall profile of the second spacer, wherein n is an integer greater than or equal to 2. Each cycle of the n cycles of spacer trimming process comprises a step of oxygen stripping and a successive step of chemical oxide removal. The patterned photoresist is then removed to reveal the first region.

According to some embodiments, the second spacer comprises a silicon oxycarbon nitride (SiOCN) film and a silicon nitride (SiN) film between the SiOCN film and the dielectric layer.

According to some embodiments, a sidewall of the SiOCN film is subjected to the n cycles of spacer trimming process.

According to some embodiments, the method further comprises: removing a silicon dioxide film from a bottom surface of the second gate trench.

According to some embodiments, the silicon dioxide film is removed during the n cycles of spacer trimming process.

According to some embodiments, the method of claim 1 further comprises: removing a fin corner oxide from a bottom of the second spacer.

According to some embodiments, the step of oxygen stripping comprises $O_2$ plasma treatment.

According to some embodiments, the step of chemical oxygen removal comprises reacting an oxide material on the second spacer with hydrofluoric (HF) and ammonia gasses.

According to another aspect of the present disclosure, a semiconductor device includes a substrate having two source/drain regions and a channel region between the two source/drain regions; a dielectric layer on the substrate, wherein the dielectric layer has a gate trench above the channel region; a spacer on a sidewall of the gate trench; an undercut region directly under the spacer; a high-k dielectric layer conformally covering the dielectric layer, the spacer, and interior surface of the gate trench; and a metal gate within the gate trench.

According to some embodiments, the spacer comprises a silicon oxycarbon nitride (SiOCN) film and a silicon nitride (SiN) film between the SiOCN film and the dielectric layer.

According to some embodiments, the undercut is situated directly under the SiOCN film.

These and other objectives of the present invention will no doubt become obvious to those of ordinary skill in the art after reading the following detailed description of the preferred embodiment that is illustrated in the various figures and drawings.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a method of manufacturing a semiconductor device according to an embodiment will be described with reference to FIGS. 1-9, FIGS. 10A-10E, FIGS. 11A-11E, and FIGS. 12A-12E. FIGS. 1-9 are schematic, cross-sectional diagrams showing a method of forming a semiconductor device according to one embodiment of the present invention.

Figure 1:
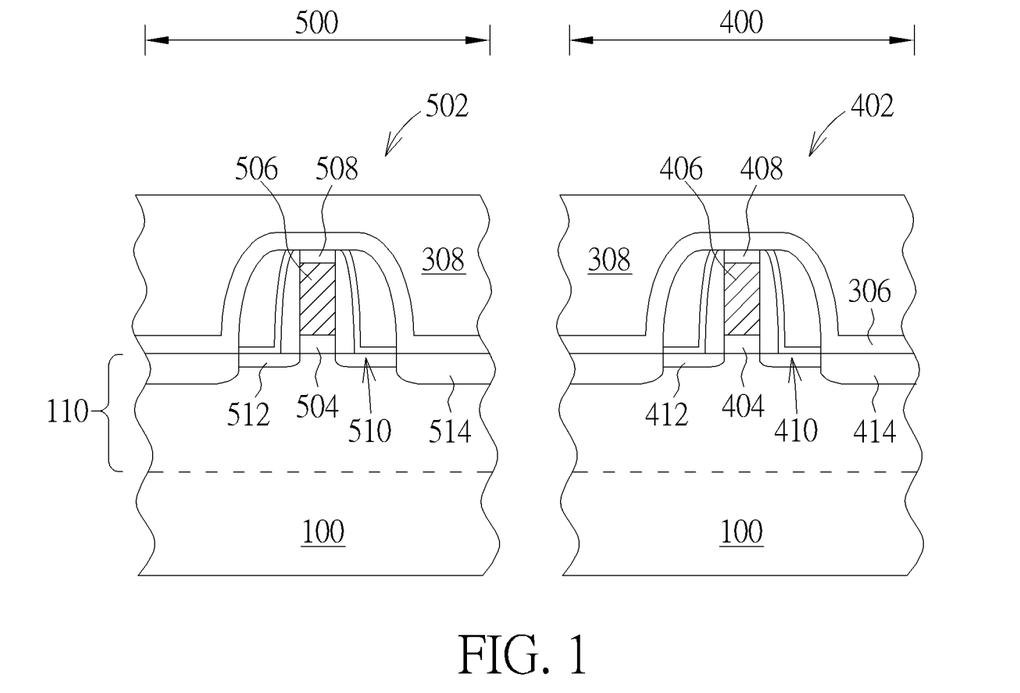
FIG. 1 to FIG. 9 are schematic, cross-sectional diagrams showing a method of forming a semiconductor device according to one embodiment of the present invention.

The present invention is directed to solve the issue of CD bias caused by spacer consumption during the oxide removal process in replacement metal gate (RMG) process loop. FIG. 1 illustrates a cross-section view of forming such dummy gate structure 120 according to one embodiment of the present invention. Referring to FIG. 1, a substrate 100 is provided to serve as a base for forming the semiconductor device. The substrate 100 may be bulk silicon or an SOI (silicon-on-insulator), but is not limited thereto. For example, the substrate 100 may be a silicon substrate or a substrate containing other materials, e.g., silicon germanium (SiGe), indium antimonide (InSb), a lead telluride compound, indium arsenic (InAs), indium phosphide (InP), gallium arsenide (GaAs), or gallium antimonide (GaSb). In some embodiments, the substrate 100 may be formed such that an epitaxial layer is formed on a base substrate.

The substrate 100 comprises multiple fin type active patterns 110. For the sake of simplicity, only one of the multiple fin type active patterns 110 is shown in FIG. 1. A device isolation layer (not shown) covers a part of a side of the fin type active pattern 110 so that the fin type active pattern 110 may protrude on, e.g., above, the device isolation layer which is formed on the substrate 100. The fin type active pattern 110 may be a part of the substrate 100 or may include an epitaxial layer which is grown from the substrate 100. The substrate 100 comprises a first region 400 and a second region 500. For example, the first region 400 may be a high-voltage device region such as an input/output region which contains high-voltage (18V or even higher for example) MOS transistors. The second region 500 may be a low-voltage region such as a core region which contains low-voltage (0.9V or lower for example) MOS transistors. A first transistor (a high-voltage transistor) 402 and a second transistor (a low-voltage transistor) 502 are formed in the first region 400 and the second region 500, respectively.

As shown in FIG. 1, the first transistor 402 may include a first oxide layer 404, a first dummy gate 406, a first capping layer 408, a first spacer 410, a first lightly doped drain (LDD) 412 and a first source/drain 414. In one preferred embodiment of the present invention, the first oxide layer 404 directly contacts the substrate 300 and the material thereof contains oxide. In some embodiments, the first oxide layer 404 may comprise high-k dielectric material having a dielectric constant greater than 4, which is formed by chemical vapor deposition (CVD) process for example.

The high-k dielectric material may comprise rare earth metal oxides or lanthanide oxides, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto.

The first dummy gate 406 may be a polysilicon gate. In another embodiment, the first dummy gate 406 may be a multi-layered gate including a polysilicon layer, an amorphous silicon layer or a germanium layer. The first capping layer 408 may be a SiN layer for example. The first spacer 410 may be a single layer including, but not limited to, silicon oxycarbon nitride (SiOCN) or SiCN. The first spacer 410 may be a multi-layered structure including high temperature oxide (HTO), SiN, $SiO_2$, SiCN or SiN. The first LDD 412 and the first source/drain 414 are formed by appropriate implant doping.

The second transistor 502 includes a second oxide layer 504, a second dummy gate 506, a second capping layer 508, a second spacer 510, a second LDD 512 and a second source/drain 514. In one preferred embodiment, the first transistor 402 and the second transistor 502 have similar components formed in the same fabricating method. Taking the oxide layer for example, the first oxide layer 404 and the second oxide layer 504 can be formed simultaneously by a thermal oxidation process and thus the first oxide layer 404 and the second oxide layer 504 both contain $SiO_2$ and have the same thickness (30 angstroms for example). The embodiment of each component in the second transistor 502 is similar to that of the first transistor 402 and is not described repeatedly. In one embodiment, the first transistor 402 or the second transistor 502 can further include other semiconductor structures which are not explicitly shown in FIG. 1, such as a silicide layer.

After forming the first transistor 402 and the second transistor 502, a contact etch stop layer (CESL) 306 and an inter-layer dielectric (ILD) layer 308 are formed on the substrate 300 to cover the first transistor 402 and the second transistor 502. It is to be understood that the fin type active pattern 110 may be elongated along a direction perpendicular to the elongated direction of the first and second dummy gates 406 and 506, so that the first and second dummy gates 406 and 506 may traverse across multiple fin type active patterns 110.

Figure 2:
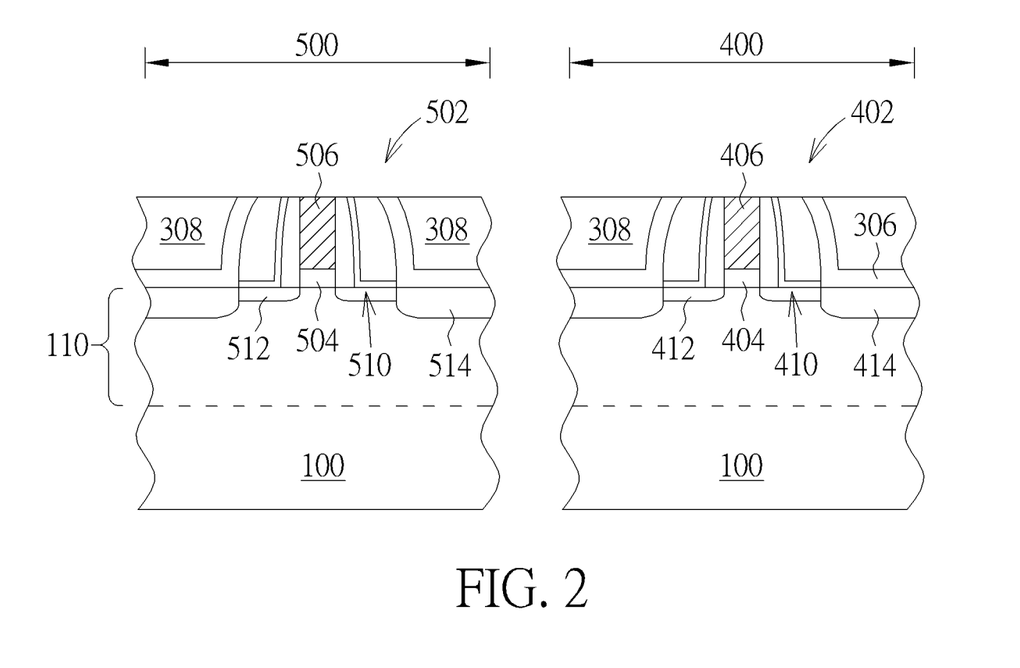

As shown in FIG. 2, a planarization process, such as a chemical mechanical polish (CMP) process or an etching-back process is performed to remove a part of the ILD layer 308, a part of the CESL 306, a part of the first spacer 410, a part of the second spacer 510, and completely remove the first capping layer 408 and the second capping layer 508, until the top surface of the first dummy gate 406 and the second dummy gate 506 are exposed.

Figure 3:
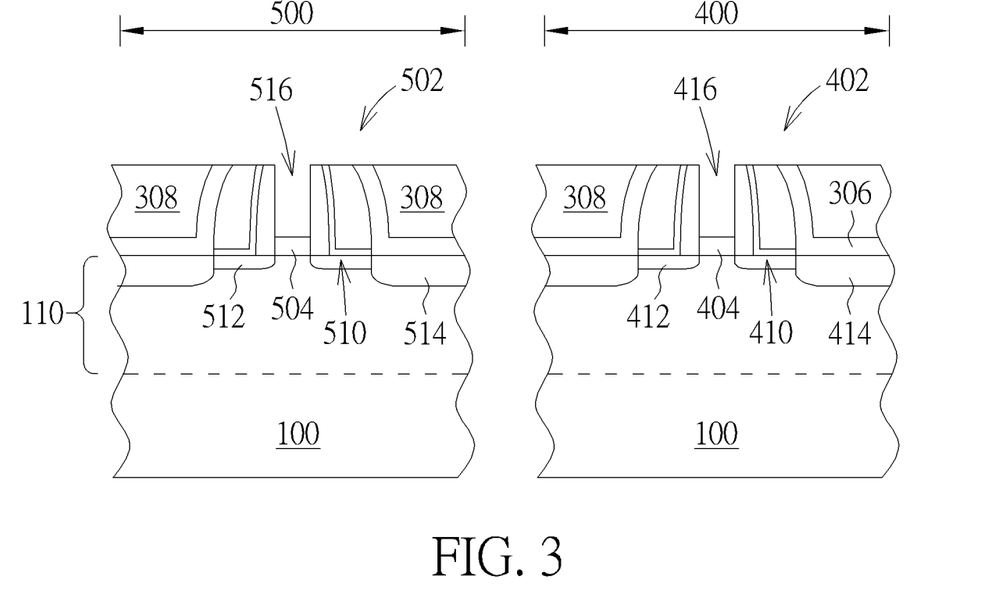

As shown in FIG. 3, an etching process is performed to remove the first dummy gate 406 and the second dummy gate 506 to respectively form a first gate trench 416 and the second gate trench 516 in the first region 400 and in the second region 500. The etching process may comprise a dry etching process and/or a wet process. For example, the dry etching process uses an etchant including HBr, $N_2$ or $NF_3$ or uses an etchant including $BCl_3$ while the wet etching may use tetramethyl ammonium hydroxide (TMAH). In another embodiment, the etching recipe of the etching process can be adjusted according to the materials of the first dummy gate 406 and the second dummy gate 506. The etching process stops on the first oxide layer 404 and the second oxide layer 504. Thus, the exposed first oxide layer 404 and the exposed first spacer 410 confine the first gate trench 416 and the exposed second oxide layer 504 and the second spacer 510 confine the second gate trench 516.

Figure 4:
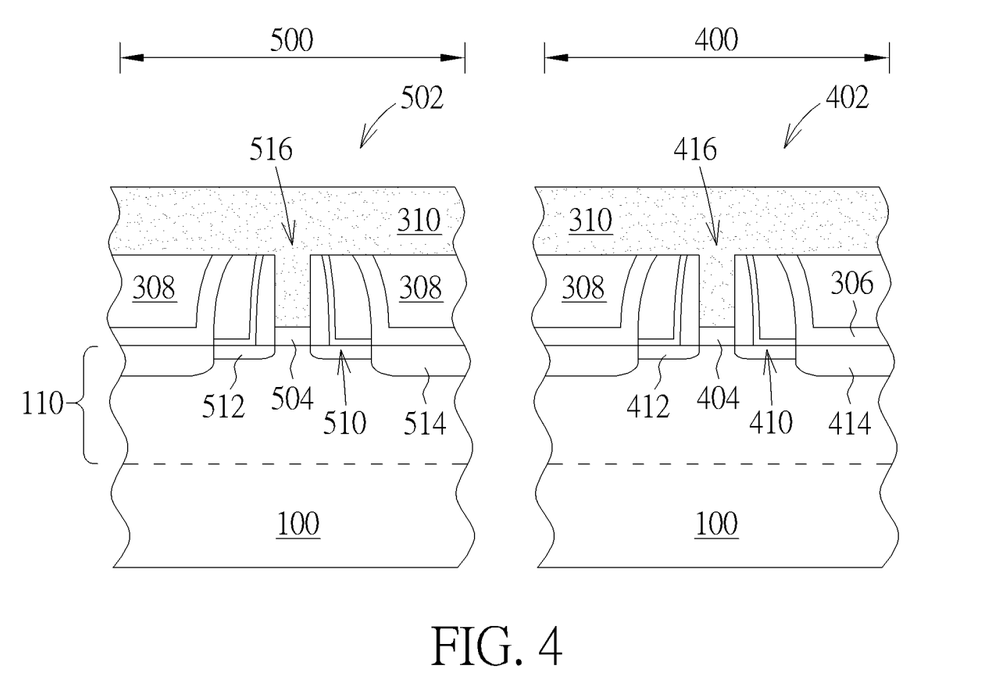

As shown in FIG. 4, a mask layer 310 is formed on the substrate 100, filling into the first gate trench 416 and the second gate trench 516 simultaneously. The mask layer 310 has an etching selectivity with respect to the first and second oxide layers 404, 504. In some embodiments, the mask layer 310 may include an organic material with good filling ability, such as spin-on glass (SOG), bottom anti-reflective coating (BARC layer), or photoresist layer. In some embodiments, the mask layer 310 may be mask material including silicon nitride (SiN), silicon carbide (SiC), silicon oxynitride (SiON), polysilicon, advanced pattern film (APF) supplied by the Applied Materials company, or combinations thereof, but is not limited thereto. In one preferred embodiment, the mask layer 310 is a photoresist.

Figure 5:
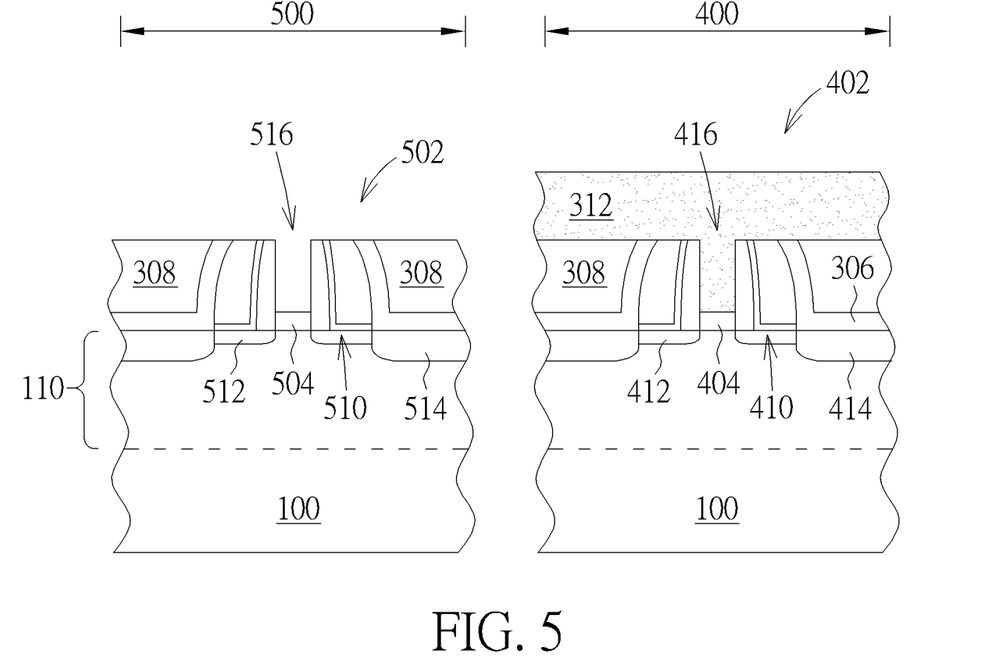

As shown in FIG. 5, a patterning process is performed to remove the mask layer 310 from the second region 500, thereby forming a patterned mask layer 312. The patterned mask layer 312 therefore exposes the second gate trench 516 as well as the second oxide layer 504 inside the second gate trench 516. When the mask layer 310 is formed of photoresist, the patterning process can be a lithography/development process. When the mask layer 310 is other material, appropriate patterning process can be performed depending on the material of the mask layer 310.

Figure 6:
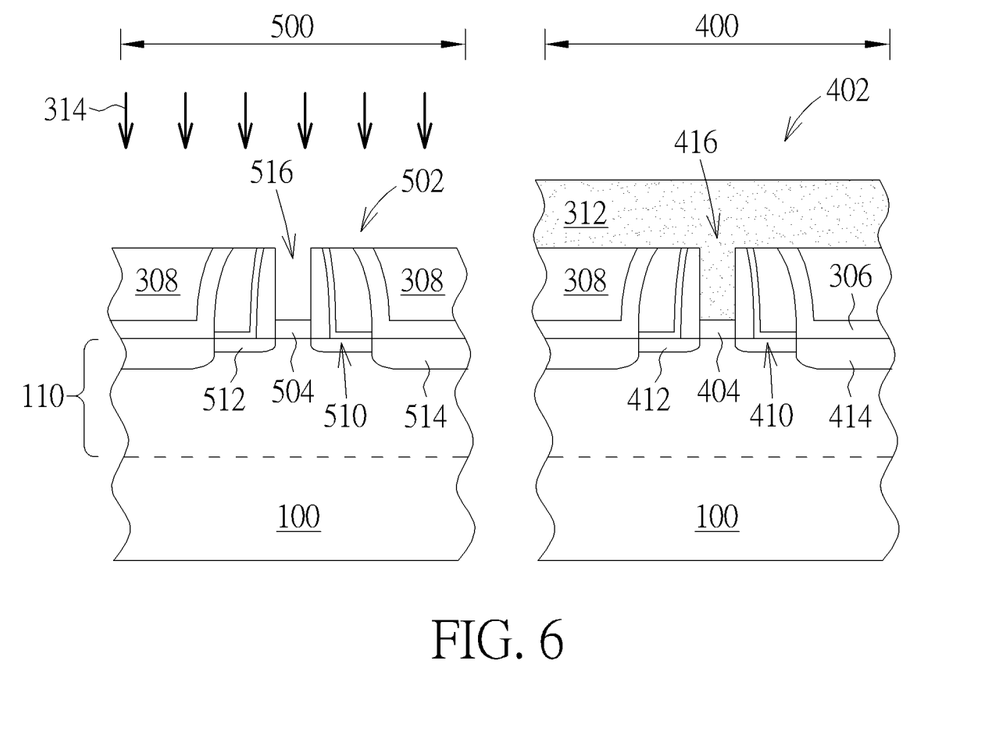

As shown in FIG. 6, a cleaning process 314 may be performed. After the patterning process in FIG. 5 is performed, organic residues may remain in the second gate trench 516. The residues may affect the subsequent steps performed for the second gate trench 516. The cleaning process 314 may be performed to remove unwanted residue of the mask layer 310 in the second gate trench 516. In some embodiments, the cleaning process 314 may be a nitride treatment. For example, the nitride treatment may be carried out by using plasma with supplying nitrogen gas ($N_2$).

Figure 7:
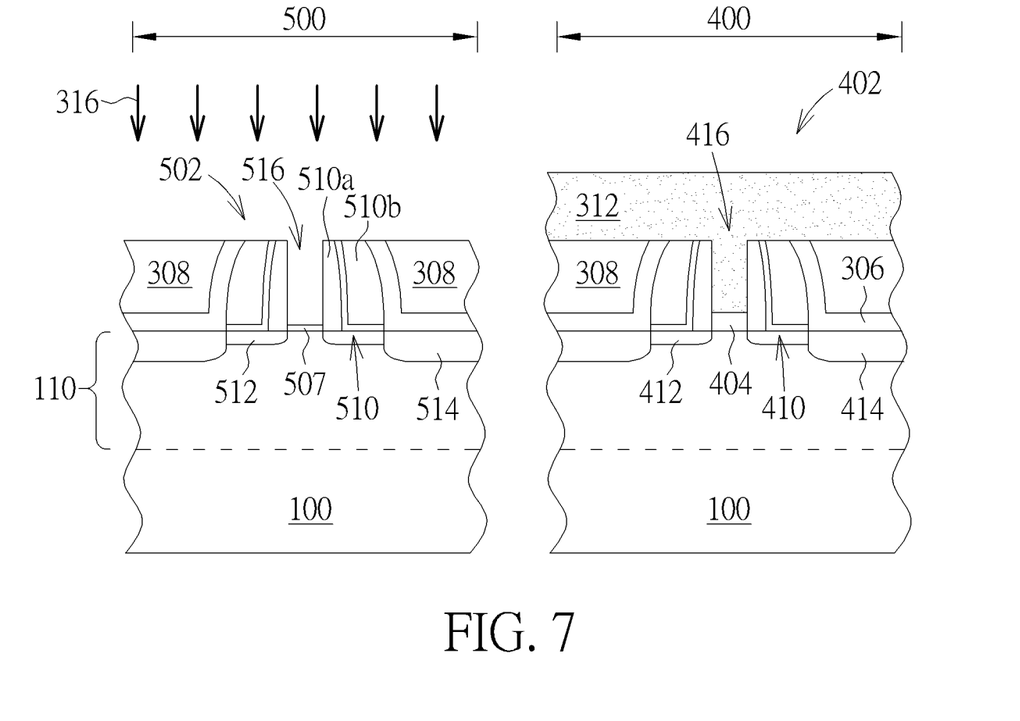

As shown in FIG. 7, an etching process 316 may be performed to remove the second oxide layer 504, and a thinner third oxide layer 507 may be formed in the second gate trench 516. In one embodiment, the etching process 316 may include using etching gas such as $NH_3$ and HF, but is not limited thereto. Subsequently, n cycles of spacer trimming process are performed to trim a sidewall profile of the first spacer 510, wherein n is an integer greater than or equal to 2. According to one embodiment, each cycle of the n cycles of spacer trimming process comprises a step of oxygen stripping and a successive step of chemical oxide removal (COR). According to one embodiment, the step of oxygen stripping comprises $O_2$ plasma treatment. According to one embodiment, during the step of chemical oxygen removal, an oxide material on the second spacer reacts with hydrofluoric (HF) and ammonia gasses.

According to one embodiment, as shown in FIG. 7, the second spacer 510 may comprise a SiOCN film 510a and a SiN film 510b between the SiOCN film 510a and the ILD layer 308. A sidewall of the SiOCN film 510a is subjected to the n cycles of spacer trimming process. According to one embodiment, during the n cycles of spacer trimming process, the third oxide layer 507 may be removed from a bottom surface of the second gate trench 516.

Figure 10A:
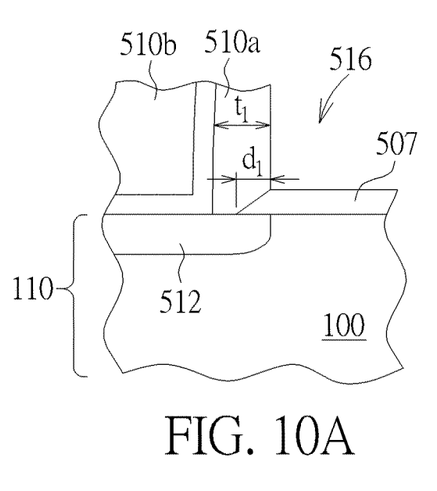
FIG. 10A to FIG. 10E are schematic, enlarged views showing the SiOCN film, the SiN film and the fin corner oxide at the bottom of the second gate trench during the n cycles of spacer trimming process according to one embodiment of the invention.

FIG. 10A to FIG. 10E are schematic, enlarged views showing the SiOCN film 510a, the SiN film 510b and the fin corner oxide FCO at the bottom of the second gate trench 516 during the n cycles of spacer trimming process according to one embodiment of the invention. As shown in FIG. 10A, the SiOCN film 510a has an original thickness $t_1$ before the n cycles of spacer trimming process are performed. At the bottom of the SiOCN film 510a, a fin corner oxide FCO having a thickness of $d_1$ may be formed.

Figure 10B:
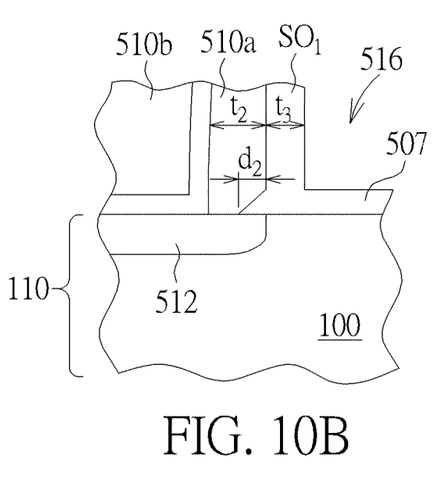
Figure 10C:
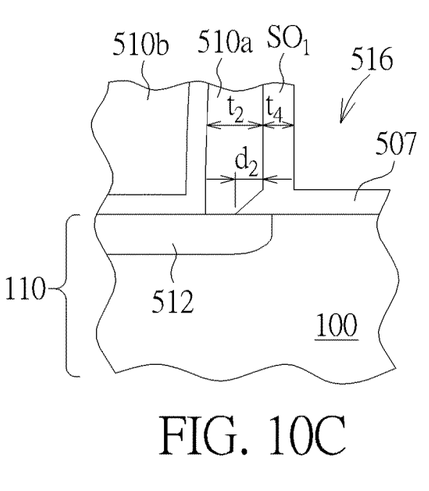

As shown in FIG. 10B and FIG. 10C, a first cycle of spacer trimming process is performed. In FIG. 10B, the sidewall of the SiOCN film 510a may be oxidized to form an oxide layer $SO_1$ having a thickness $t_3$. For example, $t_3$ may be about 10 angstroms. The remaining SiOCN film 510a has a thickness $t_2$, wherein $t_2<t_1$. In FIG. 10C, some of the oxide layer $SO_1$ is removed. The remaining oxide layer $SO_1$ has a thickness $t_4$, wherein $t_4<t_3$. For example, thickness $t_4$ may be 7-8 angstroms. It is noteworthy that at this point the thickness of the fin corner oxide FCO shrinks from $d_1$ to $d_2$.

Figure 10D:
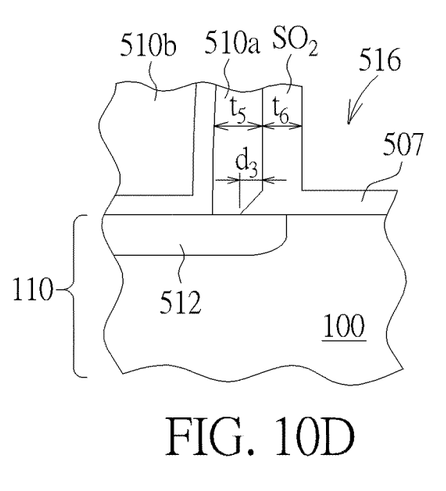
Figure 10E:
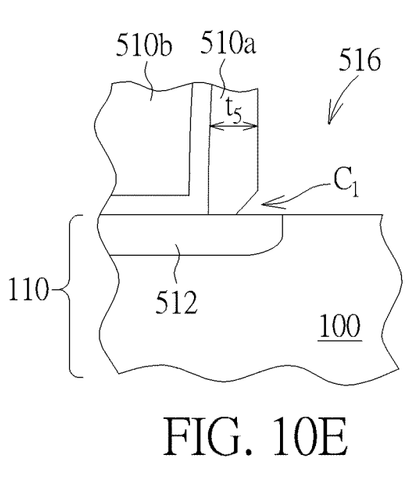

As shown in FIG. 10D and FIG. 10E, a second cycle of spacer trimming process is performed. In FIG. 10D, the sidewall of the SiOCN film 510a may be oxidized to form an oxide layer $SO_2$ having a thickness $t_6$. For example, $t_6$ may be about 10 angstroms. The remaining SiOCN film 510a has a thickness $t_5$, wherein $t_5<t_2$. It is noteworthy that at this point the thickness of the fin corner oxide FCO shrinks from $d_2$ to $d_3$. In FIG. 10E, the oxide layer $SO_2$ and the third oxide layer 507 may be completely removed. An undercut $C_1$ may be formed directly under the SiOCN film 510a.

After performing the n cycles of spacer trimming process, the patterned mask layer 312 is completely removed by using a wet clean agent, for example, a CAROZ solution, comprising, for example, sulfuric acid and hydrogen peroxide (volume ratio of about 4:1). After the patterned mask layer 312 is removed, the first region 400 is revealed.

Figure 11A:
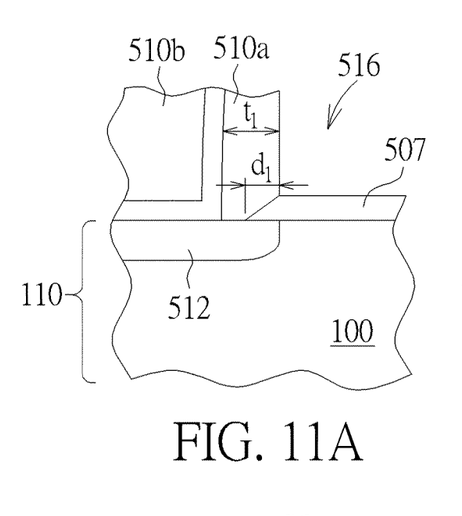
FIG. 11A to FIG. 11E are schematic, enlarged views showing the SiOCN film a, the SiN film and the fin corner oxide at the bottom of the second gate trench during the n cycles of spacer trimming process according to another embodiment of the invention.

FIG. 11A to FIG. 11E are schematic, enlarged views showing the SiOCN film 510a, the SiN film 510b and the fin corner oxide FCO at the bottom of the second gate trench 516 during the n cycles of spacer trimming process according to another embodiment of the invention. As shown in FIG. 11A, likewise, the SiOCN film 510a has an original thickness $t_1$ before the n cycles of spacer trimming process are performed. At the bottom of the SiOCN film 510a, a fin corner oxide FCO having a thickness of $d_1$ may be formed.

Figure 11B:
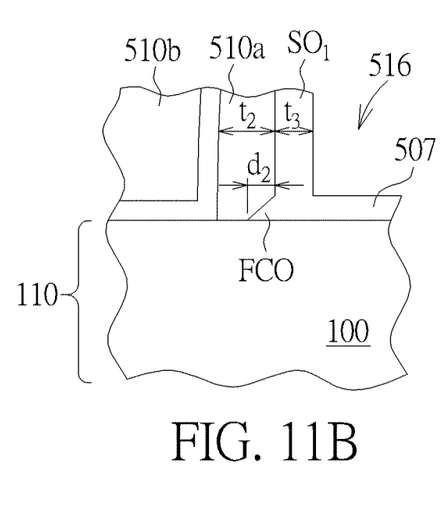
Figure 11C:
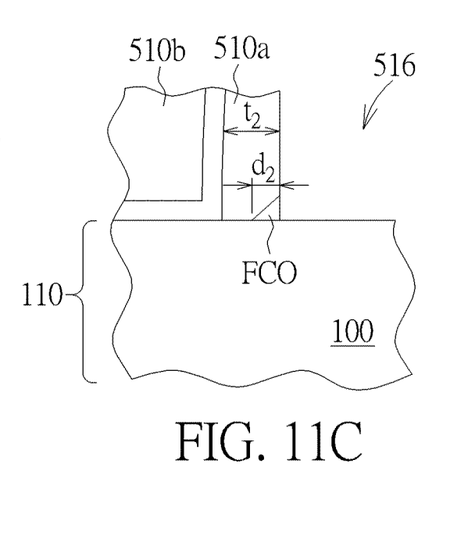

As shown in FIG. 11B and FIG. 11C, a first cycle of spacer trimming process is performed. In FIG. 11B, similar to FIG. 10B, the sidewall of the SiOCN film 510a may be oxidized to form an oxide layer $SO_1$ having a thickness $t_3$. For example, $t_3$ may be about 10 angstroms. The remaining SiOCN film 510a has a thickness $t_2$, wherein $t_2<t_1$. In FIG. 11C, the oxide layer $SO_1$ and the third oxide layer 507 may be completely removed.

Figure 11D:
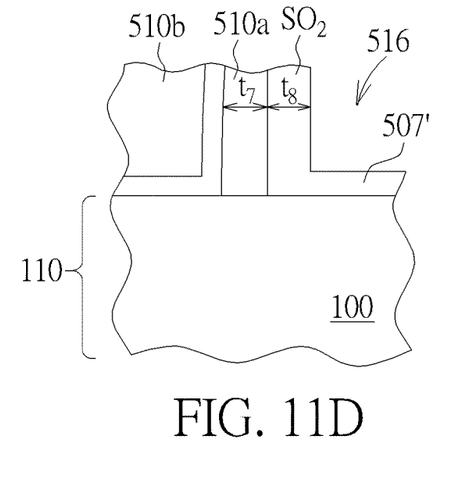
Figure 11E:
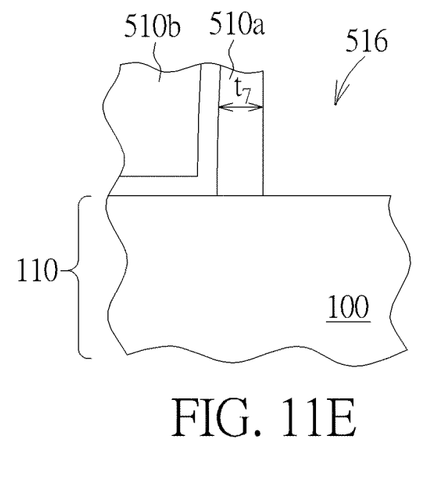

As shown in FIG. 11D and FIG. 11E, a second cycle of spacer trimming process is performed. In FIG. 11D, the sidewall of the SiOCN film 510a may be oxidized to form an oxide layer $SO_2$ having a thickness $t_8$. For example, $t_8$ may be about 3-10 angstroms. For example, $t_8$ may be equal to $d_2$. The remaining SiOCN film 510a has a thickness $t_7$, wherein $t_7<t_2$. A thin oxide layer 507' may be formed on the fin. In FIG. 11E, the oxide layer $SO_2$ and the thin oxide layer 507' may be completely removed. No undercut is formed directly under the SiOCN film 510a and a vertical sidewall profile of the SiOCN film 510a is formed.

Figure 12A:
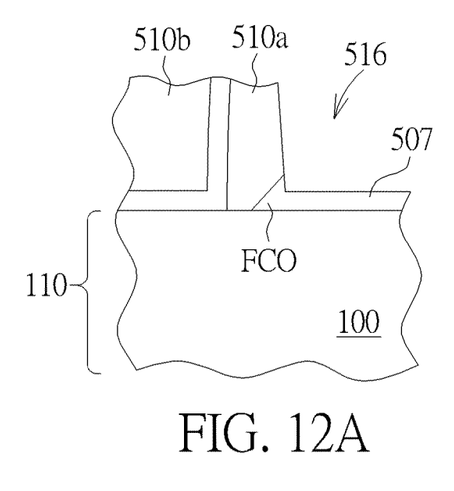
FIG. 12A to FIG. 12E are schematic, enlarged views showing the SiOCN film, the SiN film and the fin corner oxide at the bottom of the second gate trench during the n cycles of spacer trimming process according to still another embodiment of the invention.

FIG. 12A to FIG. 12E are schematic, enlarged views showing the SiOCN film 510a, the SiN film 510b and the fin corner oxide FCO at the bottom of the second gate trench 516 during the n cycles of spacer trimming process according to still another embodiment of the invention. As shown in FIG. 12A, the SiOCN film 510a has a slant sidewall profile before the n cycles of spacer trimming process are performed. At the bottom of the SiOCN film 510a, a fin corner oxide FCO may be formed.

Figure 12B:
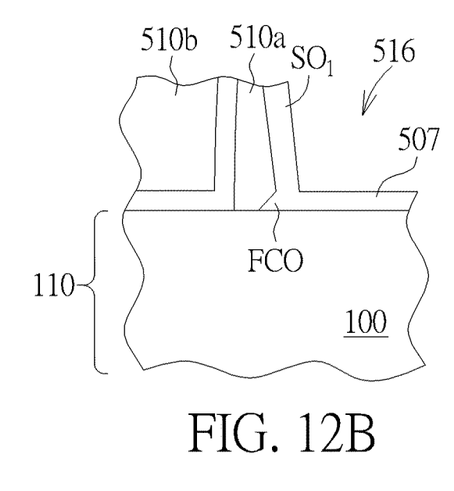
Figure 12C:
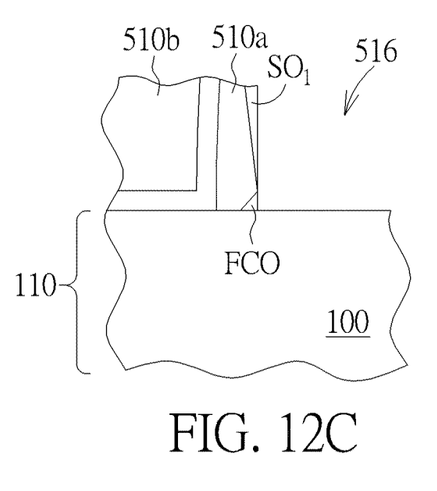

As shown in FIG. 12B and FIG. 12C, a first cycle of spacer trimming process is performed. In FIG. 12B, the sidewall of the SiOCN film 510a may be oxidized to form an oxide layer $SO_1$. In FIG. 12C, part of the oxide layer $SO_1$ and the third oxide layer 507 may be removed.

Figure 12D:
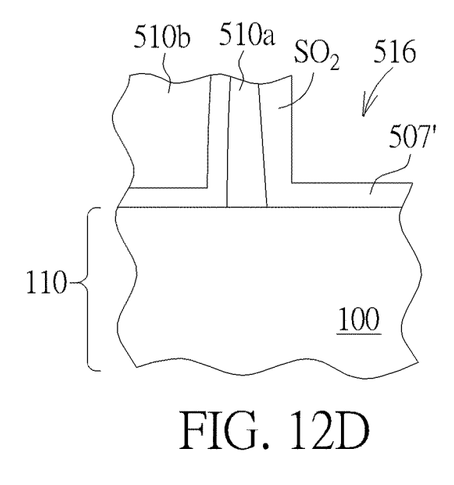
Figure 12E:
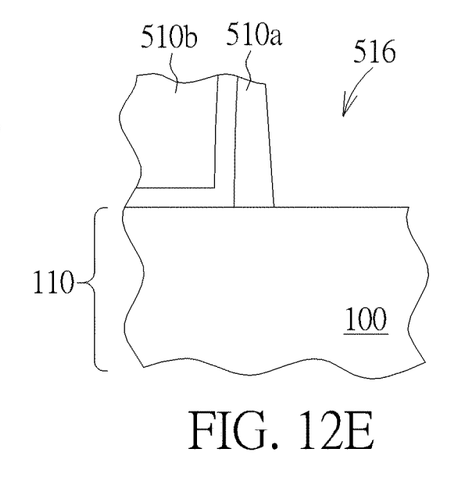

As shown in FIG. 12D and FIG. 12E, a second cycle of spacer trimming process is performed. In FIG. 12D, the sidewall of the SiOCN film 510a may be oxidized to form an oxide layer $SO_2$. A thin oxide layer 507' may be formed on the fin. In FIG. 12E, the oxide layer $SO_2$ and the thin oxide layer 507' may be completely removed. No undercut is formed directly under the SiOCN film 510a and a slant sidewall profile of the SiOCN film 510a is formed.

Figure 8:
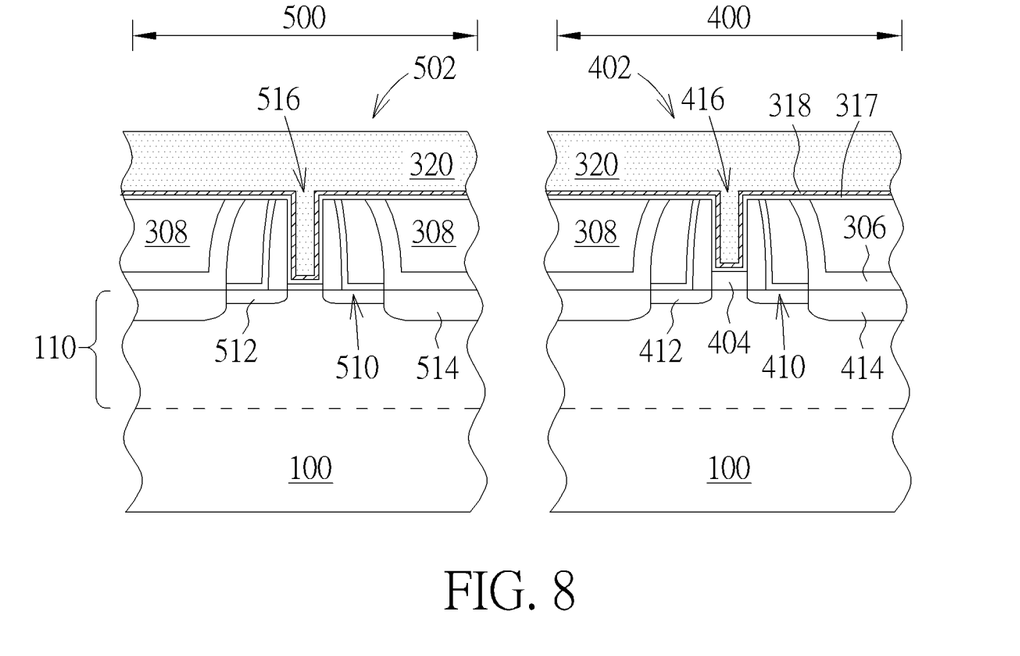

As shown in FIG. 8, a high-k dielectric layer 317 and a work function metal layer 318 may be formed on the substrate 100, which are conformally deposited into the first gate trench 416 and the second gate trench 516. The first gate trench 416 and the second gate trench 516 are not completely filled with the work function metal layer 318. Subsequently, a low-resistive metal layer 320 is formed on the substrate 100 to completely fill into the first gate trench 416 and the second gate trench 516. The high-k dielectric layer 317 may include the above mentioned high-k materials. The material of the work function metal layer 318 depends on the electrical property of the second transistor 502, for example, the work function metal layer 318 may include TiAl, ZrAl, WAl, TaAl, HfAl, TiN or TaC, but is not limited thereto. The low-resistive metal layer 320 may include Al, Ti, Ta, W, Nb, Mo, Cu, TiN, TiC, TaN, Ti/W or Ti/TiN, but is not limited thereto. In one embodiment, a single or a plurality barrier layers such as a TiN layer or a TaN layer may be formed between the high-k dielectric layer 317 and the work function metal layer 318, or between the work function metal layer 318 and the low-resistive metal layer 320.

Figure 9:
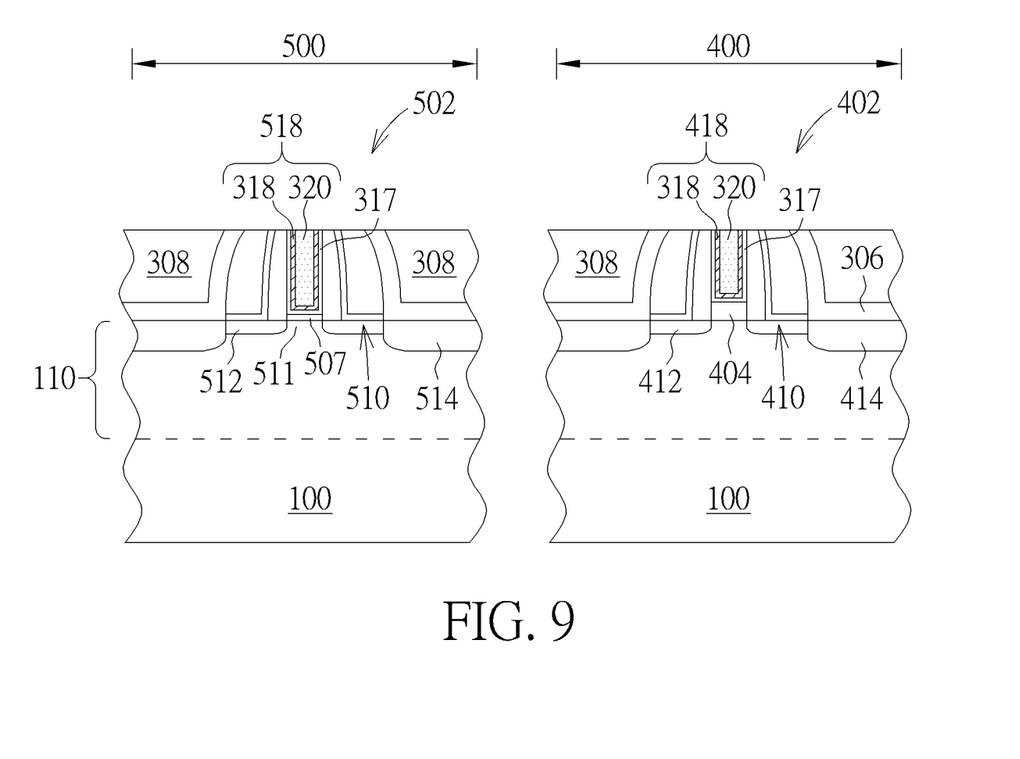

As shown in FIG. 9, a planarization process is performed to simultaneously remove the high-k dielectric layer 317, the work function metal layer 318, and the low-resistive metal layer 320 outside the first gate trench 416 and the second gate trench 516. Thus, the high-k dielectric layer 317 and the work function metal layer 318 form a U-shaped cross-section in the first gate trench 416 and the second gate trench 516. The work function metal layer 318 and the low-resistive metal layer 320 in the first gate trench 416 together form a first metal gate 418 of the first transistor 402. The work function metal layer 318 and the low-resistive metal layer 320 in the second gate trench 516 together form a second metal gate 518 of the second transistor 502.

Referring to FIG. 9 and FIG. 10E, according one aspect of the present disclosure, a semiconductor device includes a substrate 100 having two second source/drain regions 514 and a channel region 511 between the second source/drain regions 514. The ILD layer 308 is disposed on the substrate 100. The ILD layer 308 has the second gate trench 516 above the channel region 511. The spacer 510 including the SiOCN film 510a is disposed on the sidewall of the second gate trench 516. The undercut region $C_1$ is situated directly under the SiOCN film 510a of the spacer 510. The high-k dielectric layer 317 conformally covers the ILD layer 308, the spacer 510, and interior surface of the second gate trench 516. The second metal gate 518 is disposed within the second gate trench 516. It is advantageous to use the present disclosure because the CD bias caused by spacer consumption during the oxide removal process in replacement metal gate (RMG) process loop can be well controlled. The gate CD profile can be modified by employing n cycles of spacer trimming process which are compatible with current photoresist stripping process. The fin corner oxide may be removed and the device performance can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
    forming a dielectric layer on a substrate having a first region and a second region, wherein a first gate trench within the first region and a second gate trench within the second region are formed in the dielectric layer, wherein a first spacer and a second spacer are disposed in the first gate trench and the second gate trench, respectively;
    forming a patterned photoresist on the dielectric layer, wherein the patterned photoresist masks the first region and exposes the second region;
    removing a portion of a gate oxide layer from the second gate trench by etching;
    after removing the portion of the gate oxide layer from the second trench, performing n cycles of spacer trimming process to trim a sidewall profile of the second spacer, wherein n is an integer greater than or equal to 2, and wherein each cycle of the n cycles of spacer trimming process comprises a step of oxygen stripping and a successive step of chemical oxide removal; and
    removing the patterned photoresist to reveal the first region.

2. The method of claim 1, wherein the second spacer comprises a silicon oxycarbon nitride (SiOCN) film and a silicon nitride (SiN) film between the SiOCN film and the dielectric layer.

3. The method of claim 2, wherein a sidewall of the SiOCN film is subjected to the n cycles of spacer trimming process.

4. The method of claim 1, wherein removing the portion of the gate oxide layer, comprises:
    removing a silicon dioxide film from a bottom surface of the second gate trench.

5. The method of claim 4, wherein the silicon dioxide film is removed during the n cycles of spacer trimming process.

6. The method of claim 1 further comprising:
    removing a fin corner oxide from a bottom of the second spacer.

7. The method of claim 1, wherein the step of oxygen stripping comprises $O_2$ plasma treatment.

8. The method of claim 1, wherein the step of chemical oxygen removal comprises reacting an oxide material on the second spacer with hydrofluoric (HF) and ammonia gasses.

* * * * *